United States Patent [19]
Nomoto et al.

[11] Patent Number: 5,539,551
[45] Date of Patent: Jul. 23, 1996

[54] LCD TFT DRAIN AND SOURCE ELECTRODES HAVING OHMIC BARRIER, PRIMARY CONDUCTOR, AND LIQUID IMPERMEABLE LAYERS AND METHOD OF MAKING

[75] Inventors: Tsutomu Nomoto; Hideki Kamada; Ichiro Ohno, all of Hachioji, Japan

[73] Assignees: Casio Computer Co., Ltd.; Oki Electric Industry Co., Ltd., both of Tokyo, Japan

[21] Appl. No.: 168,644

[22] Filed: Dec. 16, 1993

[30] Foreign Application Priority Data

Dec. 28, 1992 [JP] Japan ................................ 4-347601
Dec. 28, 1992 [JP] Japan ................................ 4-347602

[51] Int. Cl.⁶ .......................... G02F 1/136; G02F 1/1343; H01L 29/04; H01L 31/036
[52] U.S. Cl. .................... 359/59; 359/87; 257/59
[58] Field of Search ................. 257/59; 359/59, 359/87

[56] References Cited

U.S. PATENT DOCUMENTS

| 5,162,933 | 11/1992 | Kakuda et al. | 359/87 |
| 5,198,694 | 3/1993 | Kwasnick et al. | 257/57 |

FOREIGN PATENT DOCUMENTS

| 0518296 | 12/1992 | European Pat. Off. . |
| 1144682 | 5/1979 | Japan . |
| 6077420 | 5/1985 | Japan . |
| 54061875 | 5/1985 | Japan . |
| 4278928 | 6/1989 | Japan . |
| 3-9569 | 1/1991 | Japan . |
| 4111322 | 4/1992 | Japan . |
| 60014473 | 10/1992 | Japan . |
| WO92/06505 | 4/1992 | WIPO . |

*Primary Examiner*—Anita Pellman Gross
*Assistant Examiner*—Walter J. Malinowski
*Attorney, Agent, or Firm*—Frishauf, Holtz, Goodman, Langer & Chick

[57] ABSTRACT

A plurality of address wiring layers and a plurality of data wiring layers are arranged to cross each other at a right angle. TFTs are respectively arranged at the intersections between the address wiring layers and the data wiring layers. The gate electrode of each TFT is connected to an address wiring layer for each row. The drain electrode of each TFT is connected to a data wiring layer for each column. Display electrodes are respectively arranged in the regions defined by the address wiring layers and the data wiring layers, and are connected to the source electrodes of the TFTs arranged in the respective regions. The data wiring layers and the source and drain electrodes of the TFTs each comprise the first layer serving as an ohmic barrier layer for a semiconductor layer, the second layer forming of a conductive material and serving as a main signal wiring layer, and the third layer serving as a battery reaction preventing layer.

23 Claims, 7 Drawing Sheets

LCD TFT DRAIN AND SOURCE ELECTRODES HAVING OHMIC BARRIER, PRIMARY CONDUCTOR, AND LIQUID IMPERMEABLE LAYERS AND METHOD OF MAKING

BACKGROUND OF THE INVENTION

1. Field of the Invention

The present invention relates to a thin-film transistor used for an active matrix type liquid crystal display device and a method of manufacturing the same.

2. Description of the Related Art

An active matrix type liquid crystal display device (to be referred to as an LCD hereinafter) has a TFT array. This TFT array is constituted by a large number of thin-film transistors (to be referred to as TFTs hereinafter) and display electrodes arranged in a matrix form. The TFT array comprises an insulating transparent substrate, a plurality of address wiring layers formed on the substrate to extend in the row direction, and a plurality of data wiring layers formed on the substrate in the column direction. The address and data wiring layers cross each other at right angles. The TFTs are respectively arranged at the intersections between the address wiring layers and the data wiring layers.

The gate electrodes of the TFTs of each row are connected to the corresponding address wiring layers, respectively. The drain electrodes of the TFTs of each column are connected to the corresponding data wiring layers, respectively. The display electrodes are respectively arranged in the regions defined by the address and data wiring layers and are connected to the source electrodes of the corresponding TFTs.

Figure 1:
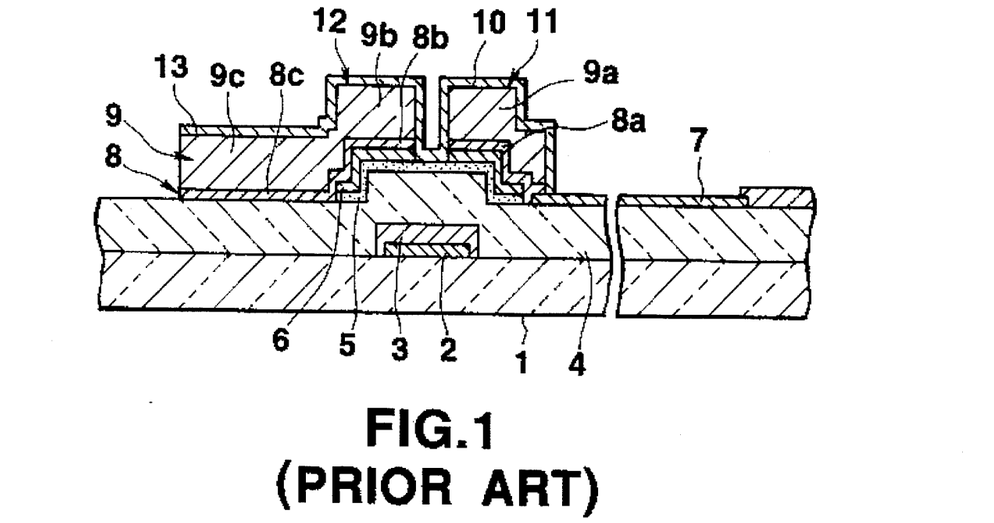
FIG. 1 is a sectional view of a conventional thin-film transistor.
Figure 2:
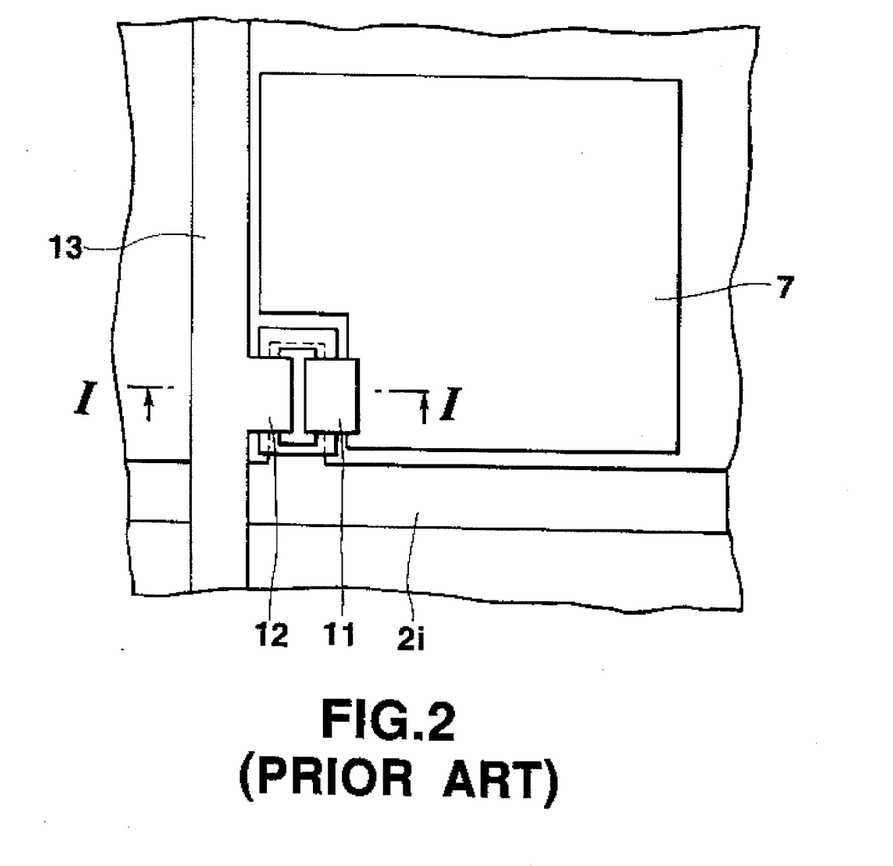
FIG. 2 is a plan view of the conventional thin-film transistor.

As a TFT used for such a conventional LCD, for example, a TFT having an arrangement like the one shown in FIGS. 1 and 2 is disclosed in Jpn. Pat. Appln. KOKAI Publication No. 3-9569. FIG. 1 is a sectional view of a TFT. FIG. 2 is a plan view of a TFT pattern. FIG. 1 is a sectional view taken along a line I—I of the pattern shown in FIG. 2.

The TFT shown in FIGS. 1 and 2 is formed in the following manner. First, a metal layer consisting of Al (aluminum), an Al alloy, Ta (tantalum), a Ta alloy, Cr (chromium), or the like is formed on an insulating transparent substrate 1 such as a glass substrate by sputtering. The formed metal layer is then patterned by photoetching or the like to form a gate electrode 2. The surface of the gate electrode 2 is anodized to form a first gate insulating film 3.

An SiN (silicon nitride) film 4 serving as the second gate insulating film, an $n^-$-type amorphous silicon layer 5 serving as a semiconductor layer, and an $n^+$-type amorphous silicon layer 6 doped with an impurity are sequentially deposited on the substrate and the first gate insulating film. The $n^-$-type amorphous silicon layer 5 and the $n^+$-type amorphous silicon layer 6 are patterned to perform element isolation.

Subsequently, a transparent film consisting of ITO (indium tin oxide) is formed on the resultant structure by sputtering. The ITO film is patterned to form a transparent display electrode 7.

An Mo (molybdenum) film 8 and an Al film 9 are deposited on the resultant structure by sputtering in the order named. These films are then patterned to form a source electrode 11, a drain electrode 12, and a data wiring layer 13. The source electrode 11 is constituted by an Mo film portion 8a and an Al film portion 9a formed thereon. The drain electrode 12 is constituted by an Mo film portion 8b and an Al film portion 9b formed thereon. The data wiring layer 13 is constituted by an Mo film portion 8c and an Al film portion 9c formed thereon.

A partial region of the Mo film portion 8a of the source electrode 11 overlaps an end portion of the display electrode 7 and is electrically connected thereto. Etching for patterning the Al film 9 and the Mo film 8 is performed by using a phosphoric-acid-based etching solution (a mixture of phosphoric acid, nitric acid, acetic acid, and water). The Mo film portions 8a and 8b serve as ohmic barrier layers for the $n^+$-type amorphous silicon layer 6 and the Al film portions 9a and 9b. Therefore, ohmic contacts can be obtained between the $n^+$-type amorphous silicon layer 6 and the Al film portion 9a, and between the $n^+$-type amorphous silicon layer 6 and the Al film portion 9b. Since Al has a low resistance, the Al film portions 9a, 9b, and 9c serve as main electrodes or main wires.

Subsequently, dry etching is performed by using the source electrode 11 and the drain electrode 12 as masks to remove a portion of the $n^+$-type amorphous silicon layer 6 between these electrodes, thereby forming a channel region of a TFT.

A surface protective film 10 consisting of SiN is formed on the resultant structure by the plasma CVD method. By removing a portion, of the surface protective film 10, formed on the display electrode 7, a TFT for a liquid crystal display device is completed.

As shown in FIG. 2, an address wiring layer 2i is formed to extend in the row direction, and a region serving as the gate electrode 2 protrudes into a prospective TFT formation region. The data wiring layer 13 extends in the column direction to cross the address wiring layer 2i at a right angle. The region 12 of the data wiring layer 13 protrudes into the prospective TFT formation region. The region 12 serves as a drain electrode.

The above-described TFT for an LCD is advantageous in that the Mo film and the Al film for forming the source electrode 11 and the drain electrode 12 can be etched by using the same etching solution. In contrast to this advantage, the following drawbacks are posed.

The etching rate of the Mo film 8 serving as an ohmic barrier layer is four to six times that of the Al film 9. For this reason, the Al film 9 is etched more than the Mo film 8. Consequently, after etching, the Al film 9 tends to have an overhanging cross-sectional shape, which tends to cause peeling or stripping of the Al film 9. If peeling or stripping of the Al film 9 occurs, disconnection of the source electrode 11 and the drain electrode 12 tends to occur in the subsequent process. In addition, a peeled Al film portion adheres to another wire. As a result, a short circuit tends to occur. For this reason, line or point defects of a liquid crystal display element tend to occur.

In order to prevent the above-mentioned overhanging, the Mo film 8 may not be formed so as to directly form the Al film 9 on the $n^+$-type amorphous silicon layer 6 and the ITO film (display electrode) 7. In this arrangement, however, no ohmic contact can be obtained between the $n^+$-type amorphous silicon layer 6 and the Al film 9. When a resist film is formed on the Al film 9 to be developed for the patterning of the Al film 9, an alkaline developing solution flows through pin holes of the Al film 9 to permeate between the ITO film 7 and the Al film 9. For this reason, a battery reaction occurs between the Al film 9 and the ITO film 7 to cause peeling of the Al film 9 and the ITO film 7, thus posing a new problem.

In addition, in order to prevent the above-mentioned overhanging, an Mo—W (tungsten) alloy film may be formed under the Al film 9 to control the etching rate. If, however, an Mo—W alloy film is formed, since the quality (composition ratio and the like) and repeatability of a film formed by sputtering are poor, it is difficult to control the etching rate. Furthermore, since an alloy target needs to be formed for a sputtering process, the manufacturing cost increases.

In the TFT having the arrangement shown in FIGS. 1 and 2, the Mo film portion 8a is formed to overlap the display electrode 7 so as to electrically connect the display electrode 7 to the source electrode 11. In this case, as the area of the overlapping portion increases, the substantial area of the display electrode 7 decreases. For this reason, only a small contact area is allowed between the display electrode 7 and the Mo film portion 8a, and hence it is difficult to ensure satisfactory electrical connection.

SUMMARY OF THE INVENTION

It is the first object of the present invention to provide a thin-film transistor which can prevent line and point defects of a liquid crystal display device, and a method of manufacturing the same.

It is the second object of the present invention to provide a thin-film transistor which can prevent a main wiring electrode from being etched into an overhanging shape, and a method of manufacturing the same.

It is the third object of the present invention to provide a thin-film transistor having an arrangement designed not to easily cause a battery reaction and the like in the manufacturing process, and a method of manufacturing the same.

It is the fourth object of the present invention to provide a thin-film transistor which can improve the reliability of electrical connection between a display electrode and a source electrode, and a method of manufacturing the same.

It is the fifth object of the present invention to provide a thin-film transistor which can simplify the manufacturing process and reduce the manufacturing cost, and a method of manufacturing the same.

In order to achieve the above objects, according to the present invention, there is provided a thin-film transistor for a liquid crystal display apparatus, comprising:

a plurality of address wiring layers;

a plurality of data wiring layers crossing the address wiring layers;

a plurality of thin-film transistors each having a gate electrode, a semiconductor layer, a source electrode, and a drain electrode, the gate electrode of each thin-film transistor being connected to a corresponding one of the plurality of address wiring layers, one of the source electrode and the drain electrode of each thin-film transistor being electrically connected to a corresponding one of the plurality of data wiring layers, and each of the source electrode and the drain electrode of each thin-film transistor including a first layer formed on the semiconductor layer and serving as an ohmic barrier layer for the semiconductor layer, a second layer formed on the first layer, essentially comprising of a conductive material, and serving as a main signal wiring layer, and a third layer formed on the second layer, exhibiting impermeability with respect to a liquid, and serving as a battery reaction preventing layer; and display electrodes arranged in a matrix form, each of the display electrodes being electrically connected to the other of the source electrode and the drain electrode of a corresponding one of the thin-film transistors.

According to the above-described arrangement, the third layer serves to prevent various types of solutions, e.g., a developing solution for a resist film from permeating the thin-film transistor, thereby preventing a battery reaction in the thin-film transistor. This leads to a reduction in pattern defect of each display electrode, which is caused by a battery reaction in the prior art. In addition, since the source and drain electrodes have a multilayered structure each, and especially the second layer is formed from a low-resistance material, their electric resistances can be reduced. Furthermore, owing the effect of the first layer, ohmic contact between the semiconductor layer, the source electrode, and the drain electrode can be ensured.

In addition, according to the present invention, there is provided a method of manufacturing a thin-film transistor, comprising the steps of:

forming a gate electrode on a substrate;

forming an insulating film on the gate electrode;

forming a semiconductor layer on the insulating film at a position corresponding to the gate electrode;

forming a first layer, serving as a barrier layer, on the semiconductor layer;

forming a conductive second layer on the first layer;

forming a third layer, exhibiting impermeability with respect to a liquid, on the second layer;

forming a resist film on the third layer, exposing the film, and developing the film by using a developing solution, thereby forming an etching mask, the third layer preventing the developing solution from permeating through the second layer in the developing step; and forming a source electrode and a drain electrode by patterning at least the first and second layers by using the etching mask.

According to the thin-film transistor manufacturing method having the above-described steps, when the resist film is developed to form the etching mask, the third layer prevents the developing solution from permeating the thin-film transistor. Therefore, no battery reaction occurs in the thin-film transistor, and pattern defects which have occurred in the prior art can be reduced. In addition, since the source and drain electrode are simultaneously patterned, the manufacturing process can be simplified. Furthermore, since the source and drain electrodes have a multilayered structure each, and especially the second layer is formed from a low-resistance material, their electric resistances can be reduced. Moreover, owing to the effect of the first layer, ohmic contacts between the semiconductor layer, the source electrode, and the drain electrode can be ensured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 3:
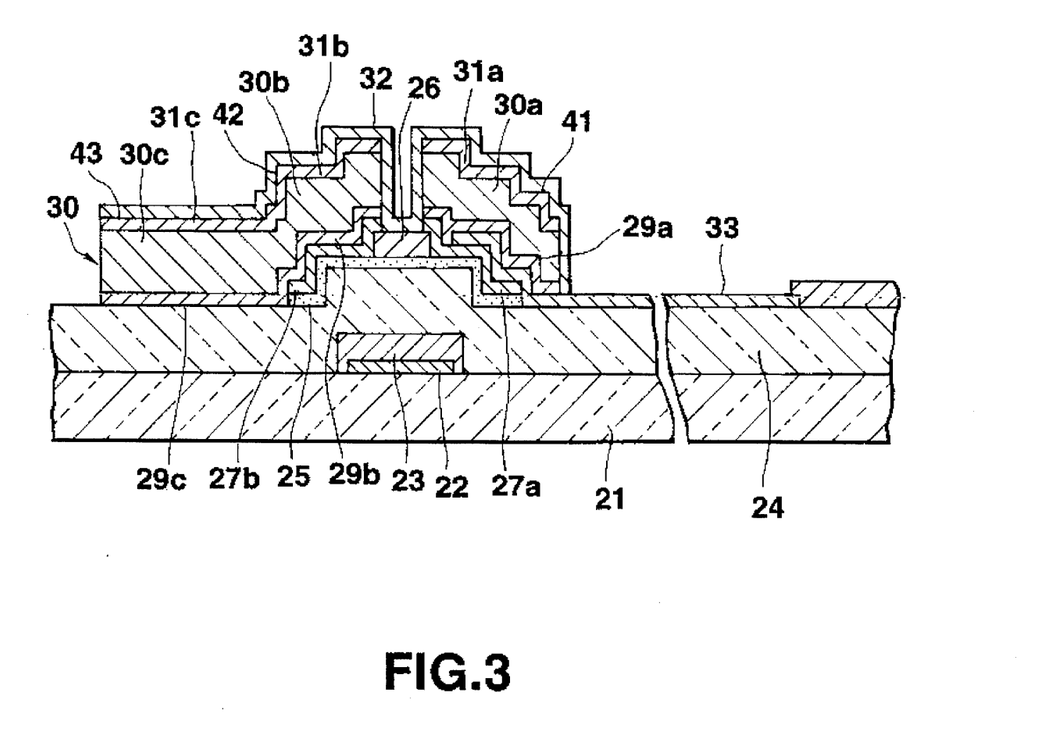
FIG. 3 is a sectional view of a thin-film transistor according to the first embodiment of the present invention.
Figure 4:
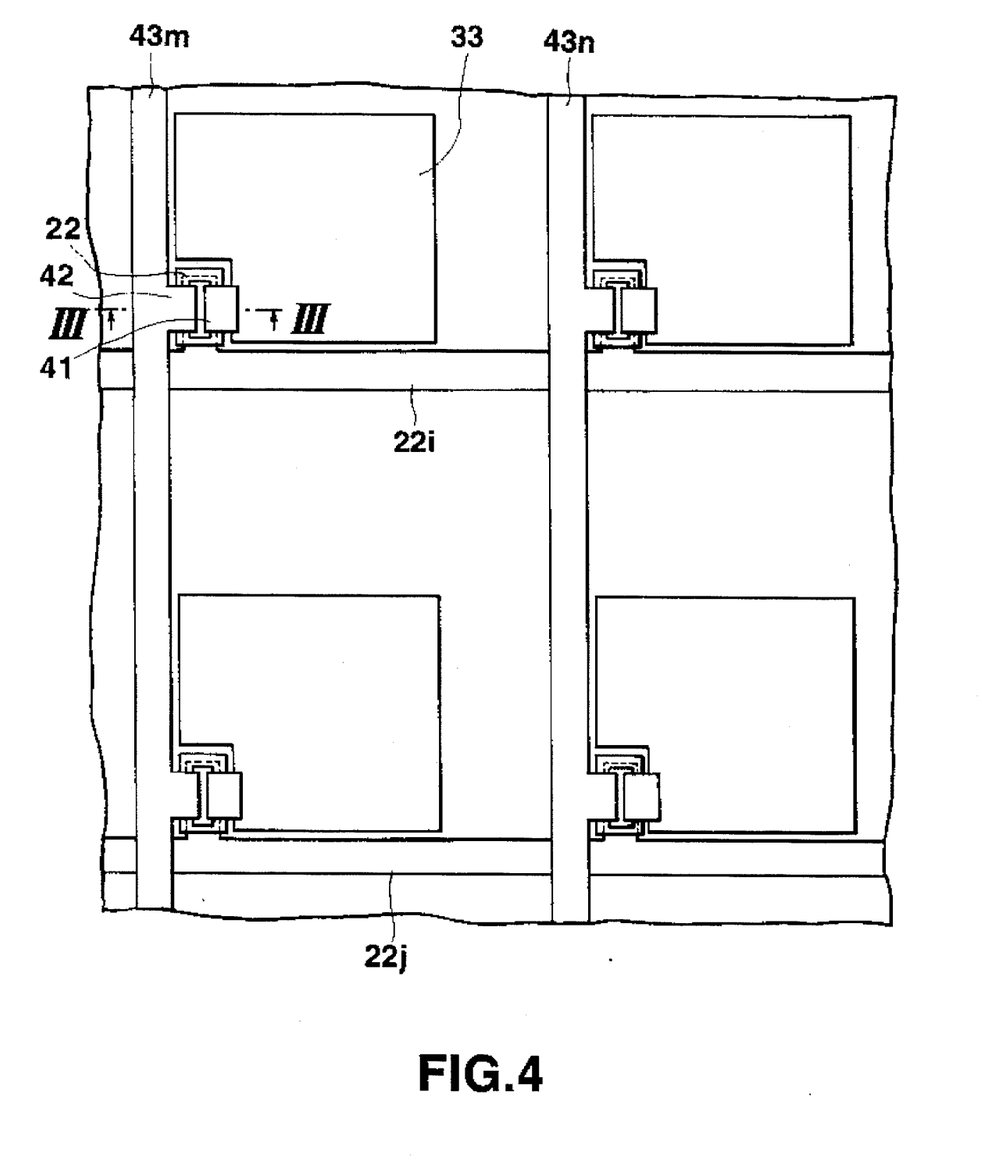
FIG. 4 is a plan view showing part of a liquid crystal display device having the thin-film transistor according to the first embodiment of the present invention.

FIG. 3 is a sectional view of a thin-film transistor (TFT) for a liquid crystal display device (LCD) according to the first embodiment of the present invention. FIG. 4 is a plan view showing part of the LCD. FIGS. 5A to 5E are sectional views sequentially showing the steps in manufacturing the TFT shown in FIG. 3. Note that FIG. 3 is a sectional view taken along a line III—III in FIG. 4.

As shown in FIG. 3, a gate electrode 22 is formed on an insulating transparent substrate 21 such as a glass substrate, and a first insulating film 23 is formed on the surface of the gate electrode 22. An SiN (silicon nitride) film serving as a second gate insulating film 24 is formed on the insulating transparent substrate 21 and the first insulating film 23. An $n^-$-type amorphous silicon layer 25 is formed on the second gate insulating film 24 at a position almost corresponding to the gate electrode 22. A blocking layer 26 formed of SiN is formed on a portion of the $n^-$-type amorphous silicon layer 25. Ohmic layers 27a and 27b are respectively formed on the $n^-$-type amorphous silicon layer 25 and the blocking layer 26. Each of the ohmic layers 27a and 27b is formed of $n^+$-type amorphous silicon. The ohmic layer 27a is formed in a prospective source electrode formation region, whereas the ohmic layer 27b is formed in a prospective drain electrode formation region.

A display electrode 33 formed of ITO (indium tin oxide) is formed on the second gate insulating film 24 and the ohmic layer 27a.

A source electrode 41 is formed on a region, of the display electrode 33, located on the ohmic layer 27a. A drain electrode 42 is formed on the ohmic layer 27b, and a data wiring layer 43 is formed on the second gate insulating film 24. The data wiring layer 43 and the drain electrode 42 are integrally formed. In other words, a partial region of the data wiring layer 43 serves as the drain electrode 42. Each of the source electrode 41, the drain electrode 42, and the data wiring layer 43 has a structure constituted by three metal layers stacked on each other. The first (lowermost) metal layer is constituted by Cr layers 29a, 29b, and 29c each having a thickness of 1 to 5 μm. The second (intermediate) metal layer is constituted by Al or Al alloy layers 30a, 30b, and 30c each having a thickness of 10 to 50 μm. As the Al alloy, an alloy containing Al and at least one of Ti, Mo, W, Ta, and Cu is used. The third (uppermost) metal layer serves as a battery reaction preventing layer and is constituted by MO layers 31a, 31b, and 31c each having a thickness of 1 to 5 μm. A surface protective film 32 consisting of SiN is formed on the Mo layers 31a, 31b, and 31c.

The above-described TFT is arranged as shown in FIG. 4. Address wiring layers 22i and 22j are arranged to extend parallel in the row direction, and a partial region of each layer, serving as a gate electrode, protrudes into a TFT formation region. Data wiring layers 43m and 43n extend in the column direction to cross the address wiring layers 22i and 22j at a right angle through insulating films. A partial region 42 of each of the data wiring layers 43m and 43n protrudes into a TFT formation region. This protruding region 42 serves as a drain electrode. The source electrode 41 is formed to be isolated from the drain electrode 42. The drain electrode 42 and the source electrode 41 are arranged such that the protruding region (gate electrode 22) of the address wiring layer 22i is located between the two electrodes.

A method of manufacturing the TFT shown in FIGS. 3 and 4 will be described next with reference to FIGS. 5A to 5E.

Figure 5A:
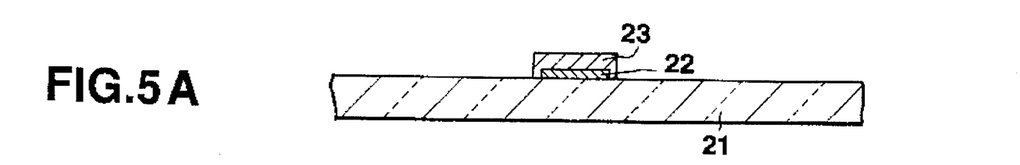
FIGS. 5A to 5E are sectional views sequentially showing the steps in manufacturing the thin-film transistor according to the first embodiment of the present invention.

As shown in FIG. 5A, a metal layer formed of Al, an Al alloy, Ta, a Ta alloy, Cr, or the like is formed on the insulating transparent substrate 21 such as a glass substrate by sputtering. The metal layer is then patterned by photoetching to form the address wiring layers 22i and 22j (not shown in FIG. 5A) and the gate electrode 22. The exposed surface of the gate electrode 22 is anodized to form the first insulating film 23.

Figure 5B:
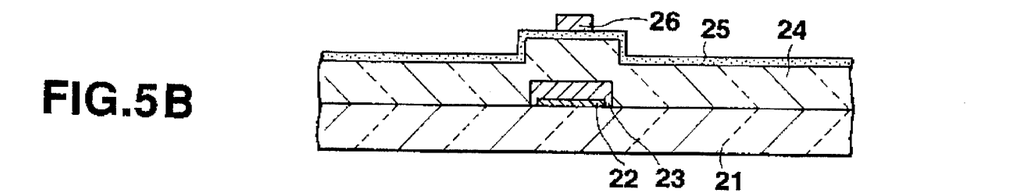

An SiN film serving as the second gate insulating film 24 is formed on the resultant structure by the plasma CVD method. The $n^-$-type amorphous silicon layer 25 is deposited on the SiN film by the plasma CVD method. An SiN film is deposited on the $n^-$-type amorphous silicon layer 25 by the plasma CVD method. As shown in FIG. 5B, the SiN film is patterned to leave the blocking layer 26 on a portion, of the $n^-$-type amorphous silicon layer 25, located above the gate electrode 22.

Figure 5C:
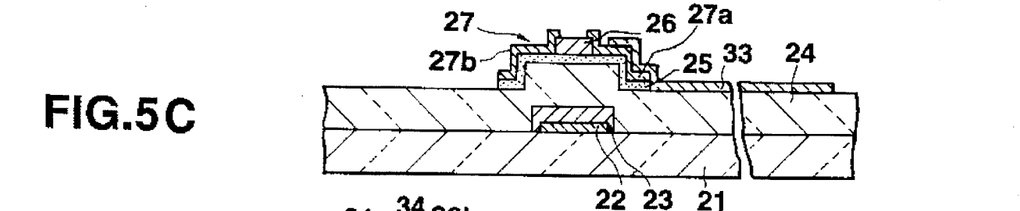

As shown in FIG. 5C, an ohmic layer 27 formed of $n^+$-type amorphous silicon is deposited by the plasma CVD method. The ohmic layer 27 and the $n^-$-type amorphous silicon layer 25 are patterned by photoetching. With this process, the ohmic layer 27a constituting a source electrode and the ohmic layer 27b constituting a drain electrode are isolated from each other. Subsequently, an ITO film is formed on the second gate insulating film 24 and the ohmic layer 27a by sputtering or the like. The ITO film is patterned to form the display electrode 33 having a partial region overlapping the ohmic layer 27a.

Figure 5D:
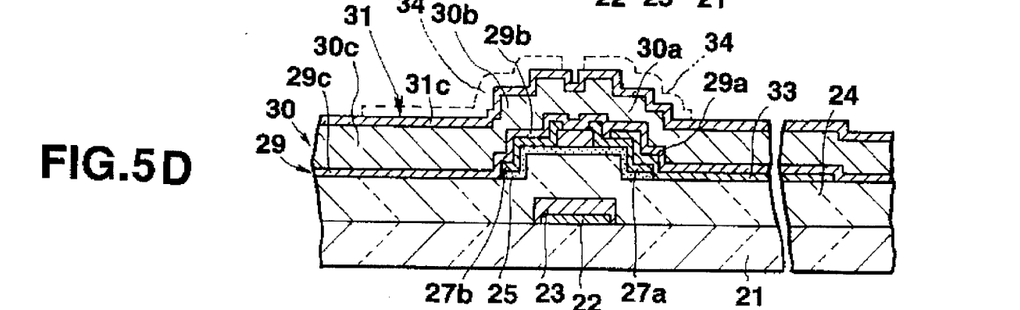

As shown in FIG. 5D, an ohmic barrier layer (ohmic layer) 29 formed of Cr and having a thickness of 1 to 5 μm, a main signal wiring layer 30, and a battery reaction preventing layer 31 are sequentially formed on the resultant structure by sputtering, vapor deposition, or the like. As the main signal wiring layer 30, an Al layer having a thickness of 10 to 50 μm is used. Alternatively, an Al alloy layer containing Al and at least one of Ti, Mo, W, Ta, and Cu may be used. As the battery reaction preventing layer 31, an Mo layer having a thickness of 1 to 5 μm may be used.

Subsequently, a resist film is formed on the battery reaction preventing layer 31 and is exposed. In addition, the resist film is developed by using an alkaline developing solution to form an etching mask 34 indicated by the broken line in FIG. 5D. Unlike an Al film, pin holes are not easily formed a an Mo film. For this reason, in the process of developing, the developing solution cannot permeate or pass through the battery reaction preventing layer 31 and hence cannot permeate the TFT, causing no battery reaction in the TFT. That is, the battery reaction preventing layer 31 prevents a battery reaction which has occurred in the prior art.

Figure 5E:
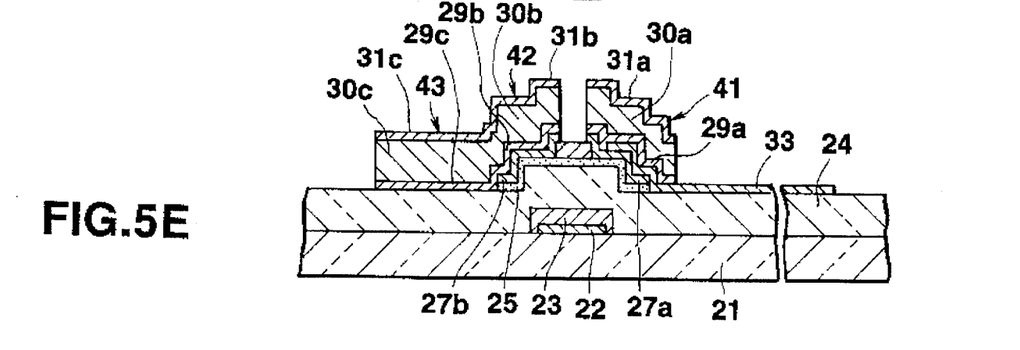

As shown in FIG. 5E, the metal layers 29, 30, and 31 are sequentially patterned by using the above-mentioned etching mask to form the source electrode 41, the drain electrode 42, and the data wiring layer 43, each having a three-layer structure. The battery reaction preventing layer 31 and the main signal wiring layer (consisting of Al or an Al alloy) 30 can be etched by using the same phosphoric-acid-based etching solution (a mixture of phosphoric acid, nitric acid, acetic acid, and water). In addition, the ohmic barrier layer (Cr) 29 is patterned by a wet etching method using an etching solution mainly formed of secondary cerium ammon acetate of or a dry etching method using a C12-based gas. As a result, the source electrode 41 is constituted by the Cr layer 29a, the Al layer 30a, and the Mo layer 31a; the drain electrode 42, by the Cr layer 29b, Al layer 30b, and the Mo layer 31b; and the data wiring layer 43, by the Cr layer 29c, the Al layer 30c, and the Mo layer 31c.

The surface protective film 32 formed of SiN is formed on the resultant structure by the plasma CVD method. The surface protective film 32 is then patterned to remove its portion on the display electrode 33, thereby completing a TFT for an LCD like the one shown in FIG. 3.

With the arrangement and the manufacturing method according to the first embodiment of the present invention, the following effects (a) to (e) can be obtained.

(a) The first ohmic barrier layer (Cr layer) 29 and the second main signal wiring layer (Al or Al alloy layer) 30 have different etching rates, and the selectivity of an etching process is high. For this reason, in etching the main signal wiring layer 30, the ohmic barrier layer 29 is not etched. In addition, since the ohmic barrier layer 29 is not an alloy film, the repeatability of quality of the film formed by sputtering is good, and the etching rate can be stably controlled. Therefore, in the etching process, side etching of the ohmic barrier layer 29 does not occur (or hardly occurs), preventing peeling or stripping of the main signal wiring layer 30. In addition, this arrangement can prevent disconnection of the source and drain electrodes owing to such peeling or stripping and can also prevent a short circuit caused when peeled Al film portions adhere to other wires, thereby preventing line and point defects of the LCD.

(b) The Mo film 31 and the Al film 30 can be simultaneously etched by using the same etching solution. In addition, the etching rate of the Mo film 31 is four to six times that of the Al film 30. Therefore, an upper portion of the Mo film 31 is tapered by etching in the process of etching the Al film 30. As a result, the step coverage of the surface protective film (SiN film) 32 to be formed in the subsequent step becomes good. That is, disconnection of the surface protective film 32 does not occur, and there is no portion which is not covered with the surface protective film 32.

(C) Since a portion of the display electrode 33 is sandwiched between the ohmic layer 27a and the ohmic barrier layer 29a, a large contact area can be ensured. In addition, the ohmic contact characteristics between Cr as the material for the ohmic barrier layer 29 and $n^+$-type amorphous silicon as the material for the ohmic layer 27 is good.

Therefore, an ohmic contact can be obtained between the display electrode 33 and the data wiring layers 22i and 22j, and the reliability of electrical connection can be improved.

(d) Unlike an Al film, an Mo film can be formed as a high-quality film having no pin holes and the like by sputtering. For this reason, in the process of forming the etching mask 34 by developing a resist film, the Mo film 31 prevents the developing solution from permeating the TFT. Therefore, no developing solution reaches the Al layer of the ITO film. This makes it difficult to cause a battery reaction, and eliminates a pattern defect of the display electrode 33.

(e) The manufacturing process can be simplified, and the manufacturing cost can be reduced because the source electrode, the drain electrode, and the data wiring layer can be simultaneously patterned.

(Second Embodiment)

Figure 6:
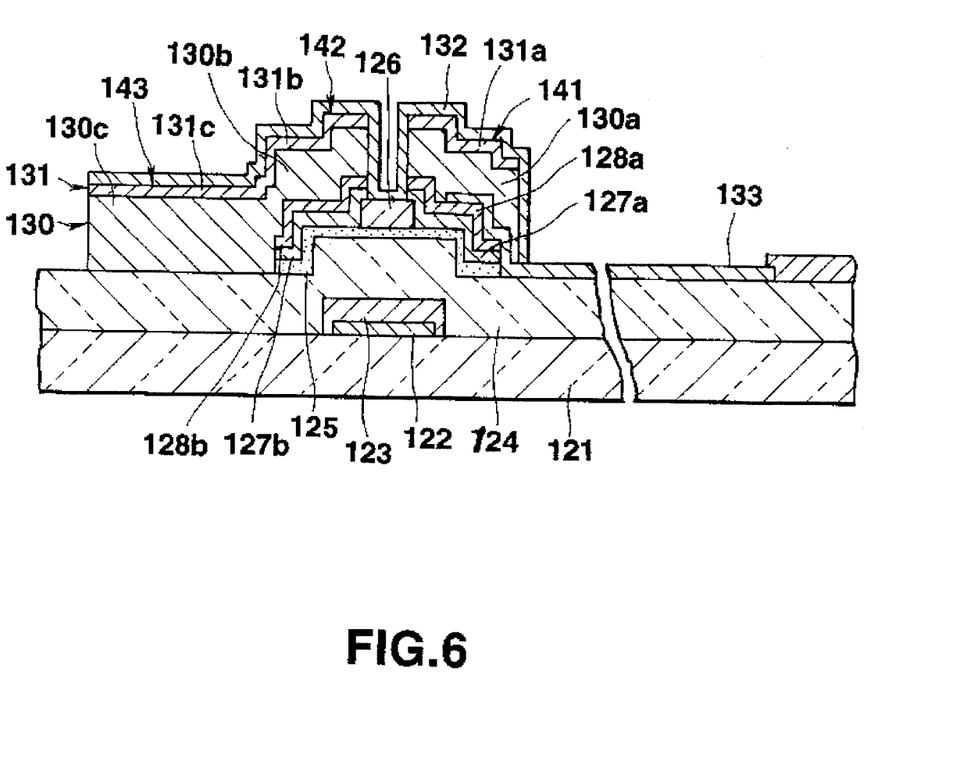
FIG. 6 is a sectional view of a thin-film transistor according to the second embodiment of the present invention.
Figure 7:
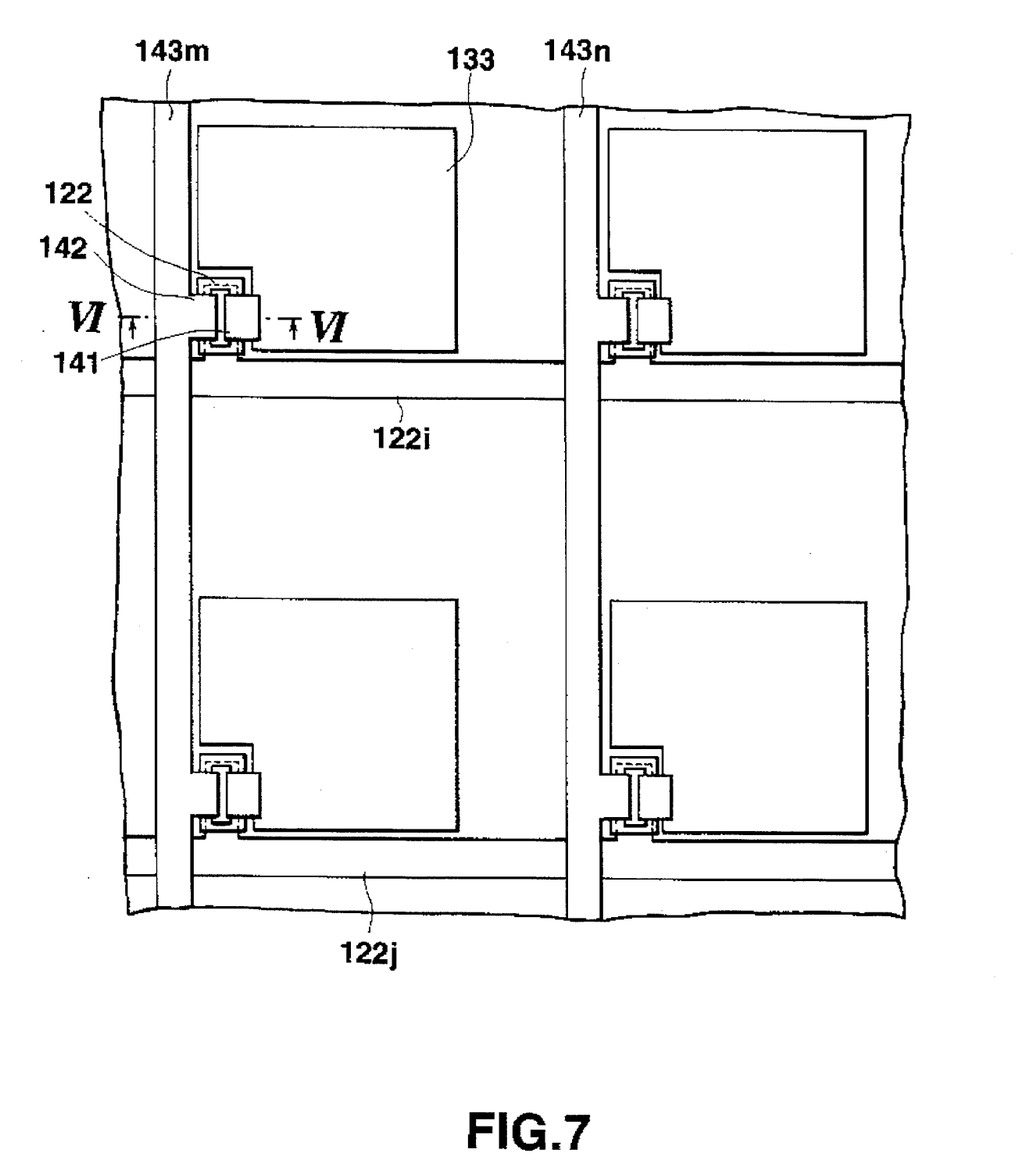
FIG. 7 is a plan view showing part of a liquid crystal display device having the thin-film transistor according to the second embodiment of the present invention.

FIG. 6 is a sectional view of a TFT for an LCD according to the second embodiment of the present invention. FIG. 7 is a plan view showing part of an LCD using the TFT. FIGS. 8A to 8E are sectional views sequentially showing the steps in manufacturing the TFT shown in FIG. 6. Note that FIG. 6 is a sectional view taken along a line VI—VI in FIG. 7, and the illustration of a surface protective film is omitted from FIG. 7.

As shown in FIG. 6, a gate electrode 122 is formed on an insulating transparent substrate 121 such as a glass substrate, and a first insulating film 123 is formed on the surface of the gate electrode 122. An SiN film serving as a second gate insulating film 124 is formed on the insulating transparent substrate 121 and the first insulating film 123. An $n^-$-type amorphous silicon layer 125 is formed on the second gate insulating film 124 at a position corresponding to the gate electrode 122. A blocking layer 126 formed of SiN is formed on a portion of the $n^-$-type amorphous silicon layer 125. Ohmic layers 127a and 127b are respectively formed on the $n^-$-type amorphous silicon layer 125 and the blocking layer 126. Each of the ohmic layers 127a and 127b is formed of $n^+$-type amorphous silicon. The ohmic layer 127a is formed in a source electrode formation region, whereas the ohmic layer 127b is formed in a drain electrode formation region.

A source electrode 141 is formed on the ohmic layer 127a. A drain electrode 142 is formed on the ohmic layer 127b. A data wiring layer 143 is formed on the second gate insulating film 124. The data wiring layer 143 and the drain electrode 142 are integrally formed.

The source electrode 141 and the drain electrode 142 each have a multilayered structure constituted by three metal layers. The first layer (lowermost layer) is constituted by Cr layers 128a and 128b each serving as an ohmic barrier layer and having a thickness of 1 to 5 µm. The second layer is constituted by Al or Al alloy layers 130a and 130b each having a thickness of 10 to 50 µm. As each Al alloy layer, an alloy layer containing Al and at least one of Ti, Mo, W, Ta, and Cu is used. The third layer is constituted by Mo layers 131a and 131b each serving as a battery reaction preventing layer and having a thickness of 1 to 5 µm. In contrast to this, the data wiring layer 143 has a multilayered structure constituted by two metal layers. The first layer of the data wiring layer 143 is formed of an Al or Al alloy layer 130c having a thickness of 10 to 150 µm. As the Al alloy layer, an alloy layer containing Al and at least one of Ti, Mo, W, Ta, and Cu is used. The second layer is formed of an Mo layer 131c having a thickness of 1 to 5 µm.

A display electrode 133 formed of an ITO film is formed on the second gate insulating film 124 to extend between the Cr layer 128a and the Al layer 130a.

A surface protective film 132 consisting of SiN is formed on the Mo layers 131a, 131b, and 131c.

The TFT is arranged as shown in FIG. 7. Address wiring layers (gate electrodes) 122i and 122j are arranged along the row direction, and a partial region, of each layer, serving as a gate electrode 122 protrudes into a prospective TFT formation region. Data wiring layers 143m and 143n are arranged along the column direction to cross the address wiring layers 122i and 122j at a right angle. A partial region 142 of each of the data wiring layers 143m and 143n protrudes into a prospective TFT formation region. This region 142 serves as a drain electrode. The source electrode 141 is formed to be isolated from the drain electrode 142. The drain and source regions 142 and 141 are arranged such that the protruding region (gate electrode 142) of the address wiring layer 122i is located between the two regions.

A method of manufacturing the TFT shown in FIGS. 6 and 7 will be described next with reference to FIGS. 8A to 8E.

Figure 8A:
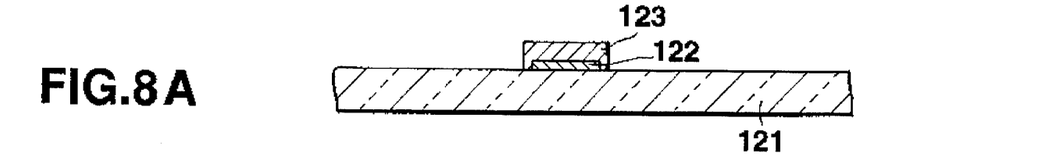
FIGS. 8A to 8E are sectional views sequentially showing the steps in manufacturing the thin-film transistor according to the second embodiment of the present invention.

As shown in FIG. 8A, a metal layer formed of Al, an Al alloy, Ta, a Ta alloy, Cr, or the like is formed on the insulating transparent substrate 121 such as a glass substrate by sputtering. This metal layer is patterned by a photoetching process to form the address wiring layers 122i and 122j and the gate electrode 122. The exposed surface of the gate electrode 122 is then anodized to form the first insulating film 123.

Figure 8B:
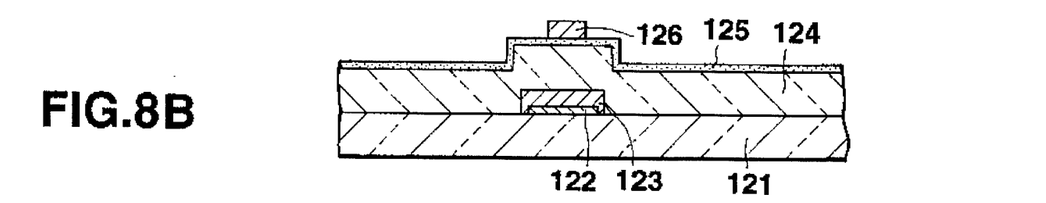

As shown in FIG. 8B, an SiN film serving as the second gate insulating film 124, the $n^-$-type amorphous silicon layer 125, and an SiN film are sequentially formed on the resultant structure by the plasma CVD method. The SiN film is patterned to form the blocking layer 126.

Figure 8C:
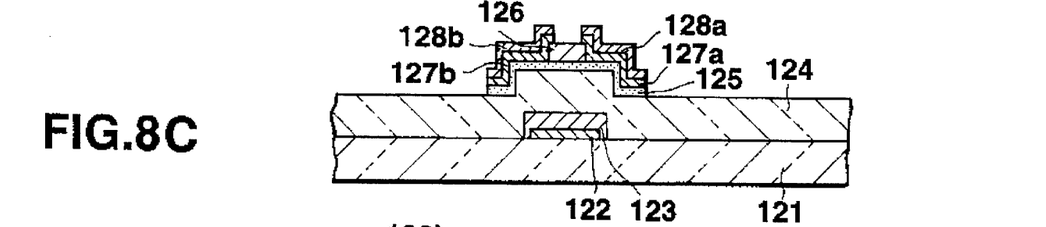

As shown in FIG. 8C, an ohmic layer 127 formed of $n^+$-type amorphous silicon is deposited by the plasma CVD method. Subsequently, an ohmic barrier layer 128 formed of Cr and having a thickness of 1 to 5 μm is deposited on the ohmic layer 127 by sputtering or vapor deposition.

The ohmic barrier layer 128, the ohmic layer 127, and the $n^-$-type amorphous silicon layer 125 are patterned by photoetching. This etching is performed by a wet etching method (using an etching solution mainly formed of secondary cerium ammon nitrate) or a dry etching method using a C12-based gas. With this process, formation and isolation of the $n^+$-type amorphous silicon layer 127a on the source electrode side, the $n^+$-type amorphous silicon layer 127b on the drain electrode side, and the first layers 128a and 128b of the source and drain electrodes of each TFT can be simultaneously performed.

Figure 8D:
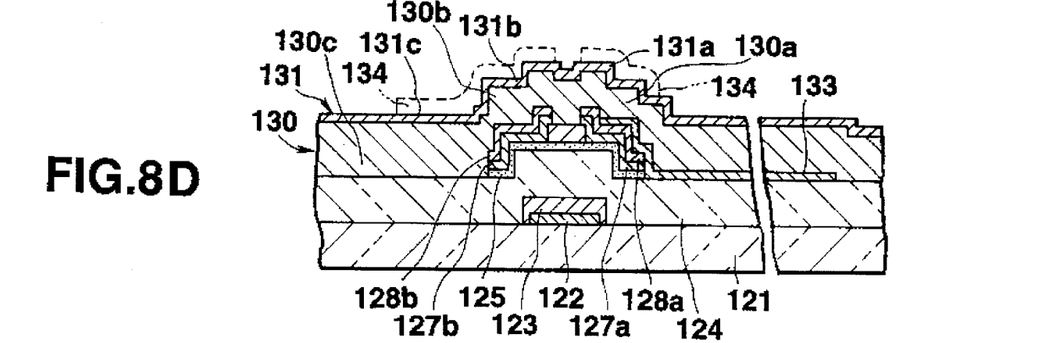

As shown in FIG. 8D, an ITO film is formed on the second gate insulating film 124 and the ohmic barrier layer 128a by sputtering. The ITO film is then patterned to form the display electrode 133 having a partial area overlapping the ohmic barrier layer 128a.

A main signal wiring layer 130 and a battery reaction preventing layer 131 are sequentially formed on the resultant structure by sputtering, vapor deposition, or the like. As the main signal wiring layer 130, an Al layer having a thickness of 10 to 50 μm is used. Alternatively, an Al alloy containing Al and at least one of Ti, Mo, W, Ta, and Cu may be used. As the battery reaction preventing layer 131, an Mo layer having a thickness of 1 to 5 μm can be used.

Subsequently, a photoresist film is formed on the resultant structure. The photoresist film is exposed and developed by using a developing solution to form an etching mask 134 indicated by the broken line in FIG. 8D. Unlike an Al film, pin holes are not easily formed in an Mo film. For this reason, in the process of developing, the developing solution cannot pass through the battery reaction preventing layer 131 and hence does not permeate the TFT. Therefore, no battery reaction occurs in the TFT. That is, the battery reaction preventing layer 131 prevents a battery reaction which has occurred in the prior art.

The battery reaction preventing layer 131 and the main signal wiring layer 130 are patterned by using this etching mask 134. In this etching process, the $n^+$-type layer 127 is separated into the $n^+$-layers 127a and 127b, and the Cr layer 128 is separated into the Cr layers 128a and 128b. However, the $n^-$-type layer 125 is not etched because of the effect of the blocking layer 126 serving as an etching stopper. Note that the Mo layer 131 and the Al or Al alloy layer 130 can be etched by using the same phosphoric-acid-based etching solution (a mixture of phosphoric acid, nitric acid, acetic acid, and water).

Figure 8E:
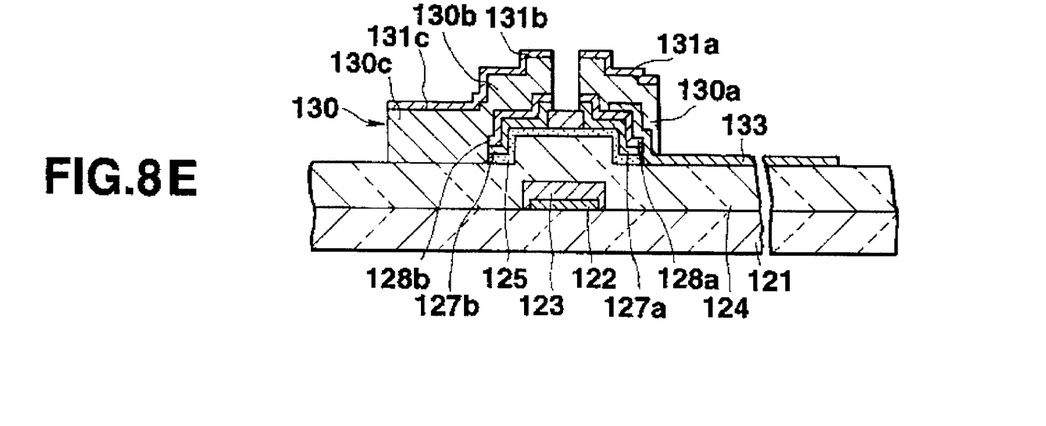

With the above-described process, the data wiring layers 134m and 143n, each having a two-layered structure, and the source electrode 141 (128a, 130a, and 131a) and the drain electrode 142 (128b, 130b, and 131b) for the TFT, each having a three-layered structure, are formed.

Finally, the surface protective film 132 formed of SiN is formed on the resultant structure by the plasma CVD method and is patterned, thereby completing a TFT for an LCD like the one shown in FIG. 6.

With the arrangement and the manufacturing method according to the second embodiment of the present invention, the following effects (1) to (4) can be obtained.

(1) The ohmic barrier layers 128a and 128b and the main signal wiring layers 130a and 130b greatly differ in etching rate, and hence the selectivity of an etching process is high. For this reason, in etching the main signal wiring layer 130, the ohmic barrier layer 128 is not etched. In addition, since the ohmic barrier layer 128 is not an alloy film, the repeatability of quality of the film formed by sputtering is good, and the etching rate can be stably controlled. Therefore, in the etching process, side etching of the ohmic barrier layer 128 hardly occurs, preventing peeling or stripping of the main signal wiring layer 130. In addition, this arrangement can prevent disconnection of the source and drain electrodes owing to such peeling or stripping, thereby preventing line and point defects of the LCD.

(2) The Mo film 131 and the Al film 130 can be simultaneously etched by using the same etching solution. In addition, the etching rate of the Mo film 131 is four to six times that of the Al film 130. Therefore, an upper portion of the Mo film 131 is tapered by etching in the process of etching the Al film 130. As a result, the step coverage of the surface protective film (SiN film) 32 formed in the subsequent step becomes good.

(3) Since the display electrode 133 is formed to extend on the Cr layer 128a, the contact area between the source electrode 141 and the battery reaction preventing layer 131 can be increased. The ohmic contact characteristics between ITO and Cr are good. In addition, the Al film (or Al alloy film) 130a is formed on the display electrode 133, and the display electrode 133 is sandwiched between the Cr layer 128a and the Al film 130a. Therefore, better ohmic contact characteristics can be obtained to improve the reliability of electrical connection.

(4) Unlike an Al film, an Mo film can be formed as a high-quality film having no pin holes and the like by sputtering. For this reason, in the process of forming the etching mask 134 by developing a resist film, the Mo film 131 prevents the developing solution from permeating the TFT. Therefore, no developing solution reaches the Al layer of the ITO film. This makes it difficult to cause a battery reaction, and eliminates a pattern defect of the display electrode 133.

The present invention is not limited to the first and second embodiments described above, and various changes and modifications can be made without departing from the spirit and scope of the invention.

For example, in the above embodiments, an ohmic barrier layer is formed of Cr; a main signal electrode is formed of Al or an Al alloy; and a battery reaction preventing layer is formed of Mo. However, other materials may be used as long as the above-described effects can be obtained.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A thin-film transistor for a liquid crystal display device comprising:

a plurality of address wiring layers;

a plurality of data wiring layers crossing said address wiring layers;

a plurality of thin-film transistors each having a gate electrode, a semiconductor layer, a source electrode, and a drain electrode, said gate electrode of each thin-film transistor being connected to a corresponding one of said plurality of address wiring layers, one of said source electrode and said drain electrode of each thin-film transistor being electrically connected to a corresponding one of said plurality of data wiring layers, and each of said source electrode and said drain electrode of each thin-film transistor including a first layer formed on said semiconductor layer and serving as an ohmic barrier layer for said semiconductor layer, a second layer formed on said first layer, essentially formed of a conductive material, and serving as a main signal wiring layer, and a third layer formed on said second layer, exhibiting impermeability with respect to a liquid, and serving as a battery reaction preventing layer; and display electrodes arranged in a matrix form, each of said display electrodes having a portion extending between said first layer and said second layer, and being electrically connected to the other of said source electrode and said drain electrode of a corresponding one of said thin-film transistors.

2. A transistor according to claim 1, in which each of said data wiring layers is integrally formed with one of said drain electrode and said source electrode of a corresponding one of said plurality of thin-film transistors, and comprises a first layer, a second layer, and a third layer.

3. A transistor according to claim 1, in which each of said data wiring layers comprises layers integrally formed with a first layer and a second layer, respectively, which constitute one of said drain electrode and said source electrode of a corresponding one of said plurality of thin-film transistors.

4. A transistor according to claim 1, in which said semiconductor layer comprises an $n^-$-type amorphous silicon layer and an $n^+$-type amorphous silicon layer formed thereon.

5. A transistor according to claim 1, in which said first layer includes a Cr layer.

6. A transistor according to claim 1, in which said second layer includes an Al or Al alloy layer.

7. A transistor according to claim 1, in which said third layer is an Mo layer.

8. A transistor according to claim 1, in which said display electrode essentially is formed of indium tin oxide.

9. A transistor according to claim 1, in which said first layer, said second layer, and said third layer have different etching rates, and wherein said third layer has an etching rate which is higher than the etching rate of said second layer, and the etching rate of said second layer is higher than the etching rate of said first layer.

10. A thin-film transistor comprising:

a gate electrode;

an insulating film formed on said gate electrode;

a first semiconductor layer formed on said insulating film at a position opposing said gate electrode;

second and third semiconductor layers formed on said first semiconductor layer so as to be separated from each other;

an ohmic barrier layer having a first etching rate, and formed above said second semiconductor layer and on said third semiconductor layer;

a main signal wiring layer having a second etching rate higher than said first etching rate of said ohmic barrier layer, and formed on said ohmic barrier layer; and a battery reaction preventing layer having a third etching rate higher than said second etching rate of said main signal wiring layer, and formed on said main signal wiring layer and exhibiting impermeability with respect to a liquid, for preventing an alkaline solution from permeating through said thin-film transistor in a manufacturing process of said thin-film transistor to cause a battery reaction therein, wherein said ohmic barrier layer, said main signal wiring layer, and said battery reaction preventing layer, which are located above said second semiconductor layer, serve as a source electrode, and said ohmic barrier layer, said main signal wiring layer, and said battery reaction preventing layer, which are located above said third semiconductor layer, serve as a drain electrode.

11. A transistor according to claim 10, which further comprises a transparent electrode for displaying an image, formed between said second semiconductor layer and said ohmic barrier layer.

12. A transistor according to claim 10, which further comprises a transparent electrode for displaying an image, formed on said insulating film and between said ohmic barrier layer and said main signal wiring layer.

13. A transistor according to claim 10, in which said first semiconductor layer essentially is formed of an $n^-$-type amorphous silicon layer, and each of said second and third semiconductor layers essentially are formed of an $n^+$-type amorphous silicon layer.

14. A transistor according to claim 10, in which said ohmic barrier layer essentially is formed of a Cr layer.

15. A transistor according to claim 10, in which said main signal wiring layer essentially is formed of an Al or Al alloy layer.

16. A transistor according to claim 10, in which said battery reaction preventing layer essentially is formed of an Mo layer.

17. A method of manufacturing a thin-film transistor, comprising the steps of:

forming a gate electrode on a substrate;

forming an insulating film on said gate electrode;

forming a semiconductor layer on said insulating film at a position corresponding to said gate electrode;

forming a first layer having a first etching rate, serving as a barrier layer, on said semiconductor layer;

forming a conductive second layer on said first layer, said conductive second layer having a second etching rate higher than said first etching rate of said first layer;

forming a third layer on said second layer, said third layer having a third etching rate higher than said second etching rate of said second layer, and exhibiting impermeability with respect to a liquid;

forming a resist film on said third layer, exposing the film, and developing the film by using a developing solution, thereby forming an etching mask, said third layer preventing the developing solution from permeating through said second layer in the developing step; and forming a source electrode and a drain electrode by patterning at least said first and second layers by using said etching mask.

18. A method according to claim 17, which further comprises a step of forming a transparent electrode on said semiconductor layer and said insulating layer, and wherein the step of forming said source electrode and said drain electrode includes the step of forming a source electrode and a drain electrode by patterning said first, second, and third layers by using said etching mask.

19. A method according to claim 17, which further comprises a step of forming a transparent electrode on said first layer and said insulating layer.

20. A method according to claim 17, in which said semiconductor layer comprises by an n⁻-type amorphous silicon layer and an n⁺-type amorphous silicon layer, said first layer comprises by a Cr layer, said second layer comprises by an Al or Al alloy layer, and said third layer comprises by an Mo layer.

21. A method of manufacturing a thin-film transistor for a liquid crystal display device, comprising the steps of:

forming a gate electrode on a substrate;

forming an insulating film on said gate electrode;

forming a semiconductor layer on said insulating film at a position corresponding to said gate electrode;

forming first and second ohmic layers on said semiconductor layer to obtain ohmic contact with said semiconductor layer;

forming a transparent electrode on said insulating film and said first ohmic layer;

forming a first layer, serving as an ohmic barrier layer, on the resultant structure;

forming a conductive second layer on said first layer;

forming a third layer on said second layer;

forming a resist film on said third layer, exposing the film, and developing the film by using a developing solution, thereby forming an etching mask for forming a source electrode and a drain electrode, said third layer preventing the developing solution from permeating through said second layer in the developing step;

patterning said third and second layers by using the same etching material and said etching mask, said third layer having a higher etching rate than said second layer, said second layer having an etching rate larger than that of said ohmic barrier layer, said third layer being tapered by etching, and said first layer being hardly etched; and patterning said first layer by using said etching mask.

22. A method of manufacturing a thin-film transistor for a liquid crystal display device, comprising the steps of:

forming a gate electrode;

forming an insulating film on said gate electrode;

forming a semiconductor layer on said insulating film at a position corresponding to said gate electrode;

separately forming first and second ohmic layers on said semiconductor layer to obtain ohmic contact therewith;

forming an ohmic barrier layer on said first and second ohmic layers;

forming a main signal wiring layer on the resultant structure;

forming a battery reaction preventing layer on said main signal wiring layer;

forming a resist film on said battery reaction preventing layer, exposing the film, and developing the film by using a developing solution, thereby forming an etching mask for forming a source electrode and a drain electrode, said battery reaction preventing layer preventing the developing solution from permeating through said main signal wiring layer; and forming a source electrode and a drain electrode by patterning said battery reaction preventing layer and said main signal wiring layer using the same etching material and the etching mask, said battery reaction preventing layer having an etching rate larger than that of said main signal wiring layer, said main signal wiring layer having an etching rate larger than that of said ohmic barrier layer and said battery reaction preventing layer being tapered by etching.

23. A thin-film transistor for a liquid crystal display device comprising:

a plurality of address wiring layers;

a plurality of data wiring layers crossing said address wiring layers;

a plurality of thin-film transistors each having a gate electrode, a semiconductor layer, a source electrode, and a drain electrode, said gate electrode of each thin-film transistor being connected to a corresponding one of said plurality of address wiring layers, one of said source electrode and said drain electrode of each thin-film transistor being electrically connected to a corresponding one of said plurality of data wiring layers, and each of said source electrode and said drain electrode of each thin-film transistor including a first layer formed on said semiconductor layer and serving as an ohmic barrier layer for said semiconductor layer, a second layer formed on said first layer, essentially is formed of a conductive material, and serving as a main signal wiring layer, and a third layer formed on said second layer, exhibiting impermeability with respect to a liquid, and serving as a battery reaction preventing layer; and display electrodes arranged in a matrix form, each of said display electrodes having a portion extending between said semiconductor layer and said first layer, and being electrically connected to the other of said source electrode and said drain electrode of a corresponding one of said thin-film transistors.

* * * * *